United States Patent
Hou et al.

(10) Patent No.: US 10,641,836 B1
(45) Date of Patent: May 5, 2020

(54) BATTERY STATE OF HEALTH ESTIMATION USING OPEN CIRCUIT VOLTAGE SLOPE

(71) Applicants: Chongqing Jinkang New Energy Automobile Co., Ltd., Chongqing (CN); SF Motors Inc., Santa Clara, CA (US)

(72) Inventors: Jun Hou, Santa Clara, CA (US); Min Tian, Santa Clara, CA (US); Chen-Yen Yu, Santa Clara, CA (US); Junzhe Shi, Santa Clara, CA (US); Saeed Khaleghi Rahimian, Santa Clara, CA (US); Ying Liu, Santa Clara, CA (US)

(*) Notice: Subject to any disclaimer, the term of this patent is extended or adjusted under 35 U.S.C. 154(b) by 0 days.

(21) Appl. No.: 16/269,450

(22) Filed: Feb. 6, 2019

(51) Int. Cl.
| | | |
|---|---|---|
| H02J 7/00 | (2006.01) | |
| G01R 31/392 | (2019.01) | |
| G01R 31/36 | (2020.01) | |
| G01R 31/3842 | (2019.01) | |

(52) U.S. Cl.
CPC ....... G01R 31/392 (2019.01); G01R 31/3648 (2013.01); G01R 31/3842 (2019.01)

(58) Field of Classification Search
USPC ......................................................... 320/132
See application file for complete search history.

(56) References Cited

U.S. PATENT DOCUMENTS

| | | | | |
|---|---|---|---|---|
| 6,646,419 B1* | 11/2003 | Ying | ..................... | B60W 10/26 320/132 |
| 2004/0008031 A1* | 1/2004 | Arai | ..................... | H01M 10/48 324/429 |
| 2008/0197807 A1* | 8/2008 | Simopoulos | ....... | G01R 31/3835 320/132 |
| 2012/0200266 A1* | 8/2012 | Berkowitz | ............ | H01M 10/44 320/139 |
| 2013/0066573 A1* | 3/2013 | Bond | ................... | G01R 31/392 702/63 |
| 2013/0275067 A1* | 10/2013 | Mikuteit | ................. | G06F 17/00 702/63 |
| 2015/0349385 A1* | 12/2015 | Hu | ......................... | H01M 10/48 429/91 |
| 2015/0377976 A1* | 12/2015 | Maluf | ................... | H02J 7/0047 702/63 |
| 2016/0146898 A1* | 5/2016 | Lennevi | .................. | B60L 58/16 324/426 |
| 2016/0259010 A1* | 9/2016 | Syouda | ............... | H01M 10/486 |
| 2017/0005488 A1* | 1/2017 | Suzuki | .................. | H01M 10/48 |
| 2017/0205469 A1* | 7/2017 | Song | ..................... | H01M 10/48 |

* cited by examiner

*Primary Examiner* — Samuel Berhanu
(74) *Attorney, Agent, or Firm* — Kilpatrick Townsend & Stockton, LLP

(57) ABSTRACT

Various arrangements for determining the state of health (SOH) of a battery of an electric vehicle are presented. A first OCV of the battery of the electric vehicle may be determined. Coulomb counting on the battery of the electric vehicle may be performed to determine an accumulated capacity value following the first OCV being determined. A second OCV of the battery of the electric vehicle may be determined after performing the coulomb counting. A change in OCV value may be calculated using the determined first OCV and the determined second OCV. A slope value may be determined by dividing the accumulated capacity value by the change in OCV value. The SOH of the battery may then be determined using the slope value.

17 Claims, 5 Drawing Sheets

BATTERY STATE OF HEALTH ESTIMATION USING OPEN CIRCUIT VOLTAGE SLOPE

BACKGROUND

A battery's state of health (SOH) can be a useful measure to determine how much of a battery's original capacity is currently available in the battery. Over time, a battery's performance can be expected to degrade. This degradation is due to factors such as: repeated charge and discharge cycles; exposure to varying temperatures; physical damage to the battery; etc. The battery's SOH may be used to determine how much energy can be stored by the battery, the amount of power that can be output by the battery, or both.

SUMMARY

Various embodiments are described related to a method for determining the state of health (SOH) of a battery of an electric vehicle. In some embodiments, a method for determining the state of health (SOH) of a battery of an electric vehicle is described. The method may include determining that a current state of the electric vehicle may be eligible for an open circuit voltage (OCV) determination. The method may include determining a first OCV of the battery of the electric vehicle in response to determining that the current state of the electric vehicle may be eligible for the OCV determination. The method may include performing coulomb counting on the battery of the electric vehicle to determine an accumulated capacity value in response to determining the first OCV. The method may include determining a second OCV of the battery of the electric vehicle after performing the coulomb counting. The method may include calculating a change in OCV value using the determined first OCV and the determined second OCV. The method may include determining a slope value by dividing the accumulated capacity value by the change in OCV value. The method may include determining the SOH of the battery using the slope value.

Embodiments of such a method may include one or more of the following features: determining the SOH of the battery using the slope value may include dividing the slope value by a predefined slope value. The predefined slope value may be indicative of a state of health of the battery when new. The method may include determining that the first OCV may be within a first state of charge (SOC) range. Coulomb counting may be performed in response to determining the first OCV and determining that the first OCV may be within the first SOC range. Determining that the first OCV may be within the first SOC range may include using the first OCV in combination with a predefined relationship between OCV values and SOC values. The method may include determining that the second OCV may be within a second SOC range. Determining the slope value may be performed following determining that the second OCV may be within the second SOC range. Determining that the second OCV may be within the second SOC range may include using the second OCV in combination with the predefined relationship between OCV values and SOC values. The first SOC range and the second SOC range each may be at least 15% and the first SOC range and the second SOC range may be separated by at least 15%. While performing the coulomb counting after determining the first OCV but before determining the second OCV, the battery may be charged and discharged. The method may include operating the electric vehicle at least partially based on the determined SOH value. Determining the first OCV of the battery of the electric vehicle may include estimating the first OCV. Determining the first OCV of the battery of the electric vehicle may include measuring the first OCV. Determining that the current state of the electric vehicle may be eligible for the OCV determination may include determining that the electric vehicle may have been turned off for at least a predefined period of time.

In some embodiments, an electric vehicle system for determining the state of health (SOH) of a battery of an electric vehicle is described. The system may include a vehicle battery system installed on the electric vehicle. The system may include a voltage and current measurement system that measures instantaneous voltage and current measurements of the vehicle battery system. The system may include an on-board processing system installed on the electric vehicle. The on-board processing system may include one or more processors that may be configured to determine that a current state of the electric vehicle may be eligible for an open circuit voltage (OCV) determination. The system may determine a first OCV of the battery of the electric vehicle in response to determining that the current state of the electric vehicle may be eligible for the OCV determination. The system may perform coulomb counting on the battery of the electric vehicle to determine an accumulated capacity value in response to determining the first OCV. The system may determine a second OCV of the battery of the electric vehicle after performing the coulomb counting. The system may calculate a change in OCV value using the determined first OCV and the determined second OCV. The system may determine a slope value by dividing the accumulated capacity value by the change in OCV value. The system may determine the SOH of the battery using the slope value.

Embodiments of such a system may include one or more of the following features: the on-board processing system being configured to determine the first OCV of the battery of the electric vehicle may include the on-board processing system being configured to estimate the first OCV. The on-board processing system being configured to determine the first OCV of the battery of the electric vehicle may include the on-board processing system being configured to measure the first OCV. The on-board processing system being configured to determine the SOH of the battery using the slope value may include the on-board processing system being configured to divide the slope value by a predefined slope value. The predefined slope value may be indicative of a state of health of the battery when new. The on-board processing system may be further configured to determine that the first OCV may be within a first state of charge (SOC) range. Coulomb counting may be performed in response to determining the first OCV and determining that the first OCV may be within the first SOC range. The on-board processing system being configured to determine that the first OCV may be within the first SOC range may include the on-board processing system being configured to use the first OCV in combination with a predefined relationship between OCV values and SOC values. The on-board processing system may be further configured to determine that the second OCV may be within a second SOC range. The on-board processing system being configured to determine the slope value may be performed following determining that the second OCV may be within the second SOC range.

In some embodiments, a non-transitory processor-readable medium for determining the state of health (SOH) of a battery of an electric vehicle is described. The medium may include processor-readable instructions configured to cause one or more processors to determine that a current state of the electric vehicle may be eligible for an open circuit voltage (OCV) determination. The medium may cause the one or more processors to determine a first OCV of the battery of the electric vehicle in response to determining that the current state of the electric vehicle may be eligible for the OCV determination. The medium may cause the one or more processors to perform coulomb counting on the battery of the electric vehicle to determine an accumulated capacity value in response to determining the first OCV. The medium may cause the one or more processors to determine a second OCV of the battery of the electric vehicle after performing the coulomb counting. The medium may cause the one or more processors to calculate a change in OCV value using the determined first OCV and the determined second OCV. The medium may cause the one or more processors to determine a slope value by dividing the accumulated capacity value by the change in OCV value. The medium may cause the one or more processors to determine the SOH of the battery using the slope value.

DETAILED DESCRIPTION

In the case of an electric vehicle (EV), the SOH of the EV's one or more batteries may be of particular importance. Specifically, the battery's SOH may be used to estimate a range of the EV, max power of the EV, or some combination thereof. Typically, for EVs, once the EV's battery used for vehicle propulsion reaches an 80% SOH (of the battery's original capacity), replacement of the battery is recommended. At 80%, the amount of range of the EV and the general performance experienced by the user may be diminished to the point where the battery is recognized as being a major impediment to the effective operation of the EV.

Further, for an EV battery, it may be particularly inconvenient and undesirable to fully charge and fully discharge the battery to perform a conventional SOH measurement. While such a cycle may be an accurate way of determining the battery's SOH, such a cycle may be difficult to perform on a battery that is expected to be charged and available for powering a vehicle. Further, such a full charge and discharge cycle may cause undue degradation on the battery's health.

In contrast to performing a full charge and full discharge cycle to determine a battery's SOH, the open circuit voltage (OCV) of the battery may be used to estimate the battery's SOH. More specifically, the slope of a measured accumulated charge of the battery over a change in OCV may be used to determine the battery's SOH by comparing the calculated slope to a stored slope indicative of the battery's ideal performance or performance when new.

Using the slope of the measured accumulated capacity of the battery of a change in OCV may have distinct advantages over performing measurements by performing a full charge to full discharge cycle. Specifically, using OCV measurements or estimations may be more practical for EVs and hybrid EVs, including not requiring that the battery be fully discharged, which can be dangerous if the vehicle is being operated, may increase battery degradation, or both. Additionally, SOH measurements that rely on battery internal resistance may not be accurate since a battery's internal resistance can vary due to temperature, SOC, battery life, and battery charge/discharge current. Other methods, such as incremental capacity analysis (ICA) can suffer from issues such as noise, the need for a significant amount of hardware memory, or both.

While the embodiments herein are focused on EVs and battery systems used to propel EVs, similar techniques and systems may be adapted to be used in other systems that would benefit from an SOH calculation. For example, various other situations may benefit from an accurate SOH being calculated without a battery being fully charged and fully discharged.

Figure 1:
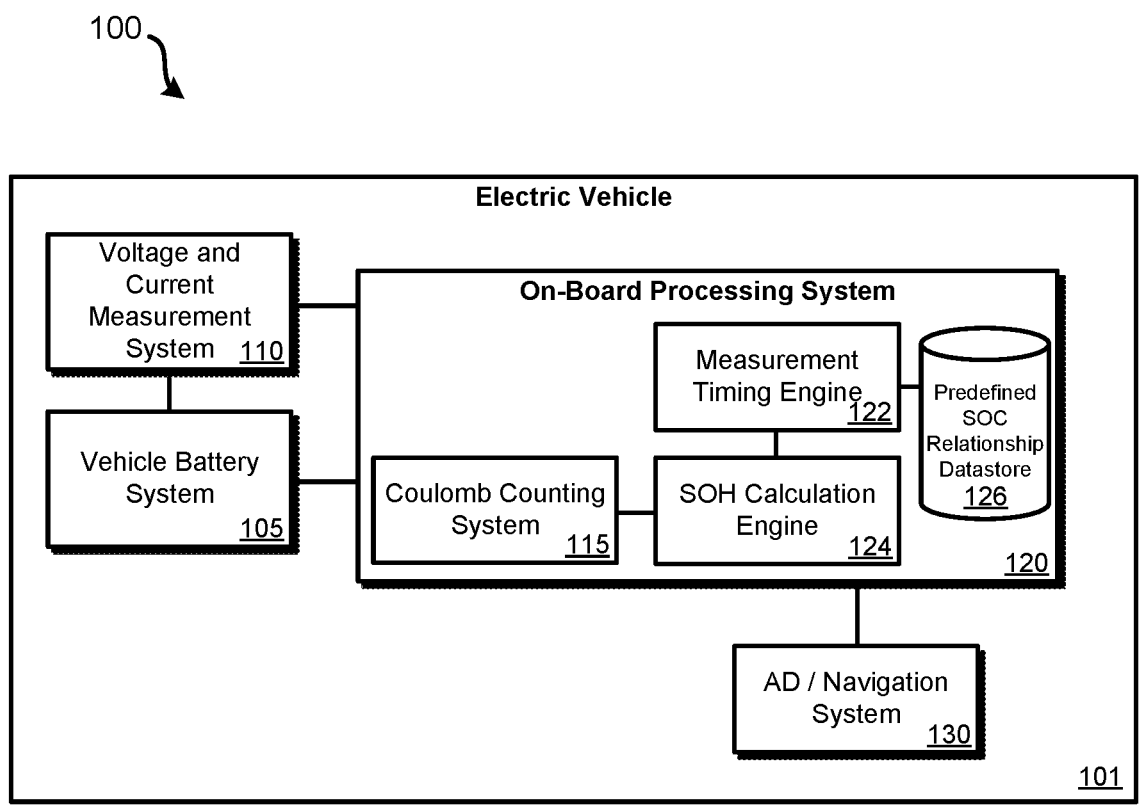
FIG. 1 illustrates a block diagram of an embodiment of an EV that uses an open circuit voltage estimation or measurement to determine the battery's SOH.

FIG. 1 illustrates a block diagram of an embodiment 100 of an EV that uses an estimated or measured open circuit voltage to determine the battery's SOH. EV 101 may have various systems and components on-board, include: vehicle battery system 105; voltage and current measurement system 110; on-board processing system 120; and autonomous driving (AD) and/or navigation system 130. Vehicle battery system 105 may include one or more batteries that are used to store power used for vehicle propulsion. Vehicle battery system 105 can be rechargeable. However, it can be expected that, over time, the performance of vehicle battery system 105 will degrade. As a general guideline, once vehicle battery system 105 has degraded to 80% of its original capacity, vehicle battery system 105 may be considered ready for replacement. Beyond determining whether vehicle battery system 105 is ready for replacement, accurately determining an SOH of vehicle battery system 105 can be used to provide an accurate estimation of how much battery life remains. Such an SOH value can be used to determine whether EV 101 has sufficient stored energy to travel to a particular destination, take a particular route, operate particular auxiliary systems (e.g., a cabin heater, an air conditioner, an entertainment system), operate the drive system in a particular mode (e.g., sport mode, economy mode), or otherwise alter the EV's operating characteristics. While not illustrated in embodiment 100, vehicle battery system 105 can be electrically connected to many systems throughout the vehicle of embodiment 100, such as to power one or more drive motors and/or one or more auxiliary systems.

Voltage and current measurement system 110, may include an ammeter and voltmeter, and may be electrically connected with vehicle battery system 105. Voltage and current measurement system 110 may be able to measure a voltage being output by vehicle battery system 105. Voltage and current measurement system 110 may be able to measure an instantaneous amount of current being input to or output from vehicle battery system 105. Generally speaking, an OCV is the difference of electrical potential between the positive and negative terminals of vehicle battery system 105 when vehicle battery system 105 is disconnected from all loads such that no current is being output by vehicle battery system 105. In order to measure the OCV of vehicle battery system 105, it may be necessary for EV 101 to be "off." That is, vehicle battery system 105 may not be in the process of being used to supply propulsion for EV 101 and may be providing no power or a limited amount of power for auxiliary systems of EV 101. Practically speaking, vehicle battery system 105 may be outputting a small amount of current, such as to power on-board processing system 120 and voltage and current measurement system 110. However, this small amount of current being output may have a negligible effect on the measured OCV. Voltage and current measurement system 110 may measure a voltage of vehicle battery system 105 after the vehicle has been "off" for a defined period of time, such as one hour or two hours. "Off" may refer to EV 101 drawing on vehicle battery system 105 for propulsion or may refer to an "ignition" or power switch of the vehicle being set to an "off" setting for the defined period of time. Voltage and current measurement system 110 may then measure the voltage across the positive and negative terminals of vehicle battery system 105 to make an OCV measurement. In some embodiments, voltage and current measurement system 110 may temporarily disconnect vehicle battery system 105 for outputting any current to achieve a more accurate OCV measurement.

Additionally or alternatively, current and voltage and current measurement system 110 can be used for estimation of the OCV. To accurately measure an OCV, a battery may need to sit idle without a significant current being output or input to the battery. For an EV, this situation may only occur when the EV is off and, thus, may not occur for extended periods of time. Therefore, estimation of the OCV may be important to perform. To do so, in some embodiments, a first-order equivalent circuit model can be used and 3 or 4 parameters (e.g., OCV, ohmic resistance, RC pair) can be estimated. Parameter identification requires signal richness (estimate n parameters, at least need n/2 distinct frequencies) such that the parameter identification converges. More precisely, if an input signal has at least one distinct frequency component for each of two unknown parameters, then it can be considered sufficiently rich. If the number of unknown parameters is n, then m>=n/2 distinct frequencies in the input signal are sufficient for the input signal to qualify as being sufficiently rich of order n. On-board processing system 120 may estimate the OCV using such a first-order equivalent circuit model when the needed conditions are satisfied.

Coulomb counting system 115 may be part of on-board processing system 120 and may receive measurements of the instantaneous amount of current being input to or output from vehicle battery system 105 vehicle battery system 105 from voltage and current measurement system 105. Besides being connected with a vehicle charger, EV 101 may use alternative ways of recharging vehicle battery system 105. For example, regenerative braking or a solar panel may be used to charge vehicle battery system 105. Coulomb counting system 115 may be used to determine the total sum of energy leaving vehicle battery system 105. Coulomb counting system 115 may integrate the instantaneous amounts of current it has received from voltage and current measurement system 110 over a period of time (of which on-board processing system 120 may provide a start and stop time). In such embodiments, coulomb counting system 115 can compensate for instantaneous measurements indicative of vehicle battery system 105 being charged (e.g., due to regenerative braking). Therefore, despite there being times at which vehicle battery system 105 is being discharged and charged during a time period, accurate coulomb counting may be performed to determine an ampere-hours value (or equivalent).

On-board processing system 120 may include one or more special-purpose or general-purpose processors. The one or more special-purpose processors (e.g., one or more ASICs or FPGAs) may be specifically programmed to perform the functions of measurement timing engine 122 and SOH calculation engine 124. The one or more general-purpose processors may execute software stored by a non-transitory processor-readable medium. The software may cause the one or more general-purpose processors to perform the function of measurement timing engine 122 and SOH calculation engine 124. In addition to one or more processors, computerized components such as one or more non-transitory processor-readable mediums, communication busses, network interfaces, power supplies, etc. may be present. On-board processing system 120 may include: measurement timing engine 122, SOH calculation engine 124, and predefined SOC relationship datastore 126.

Figure 2:
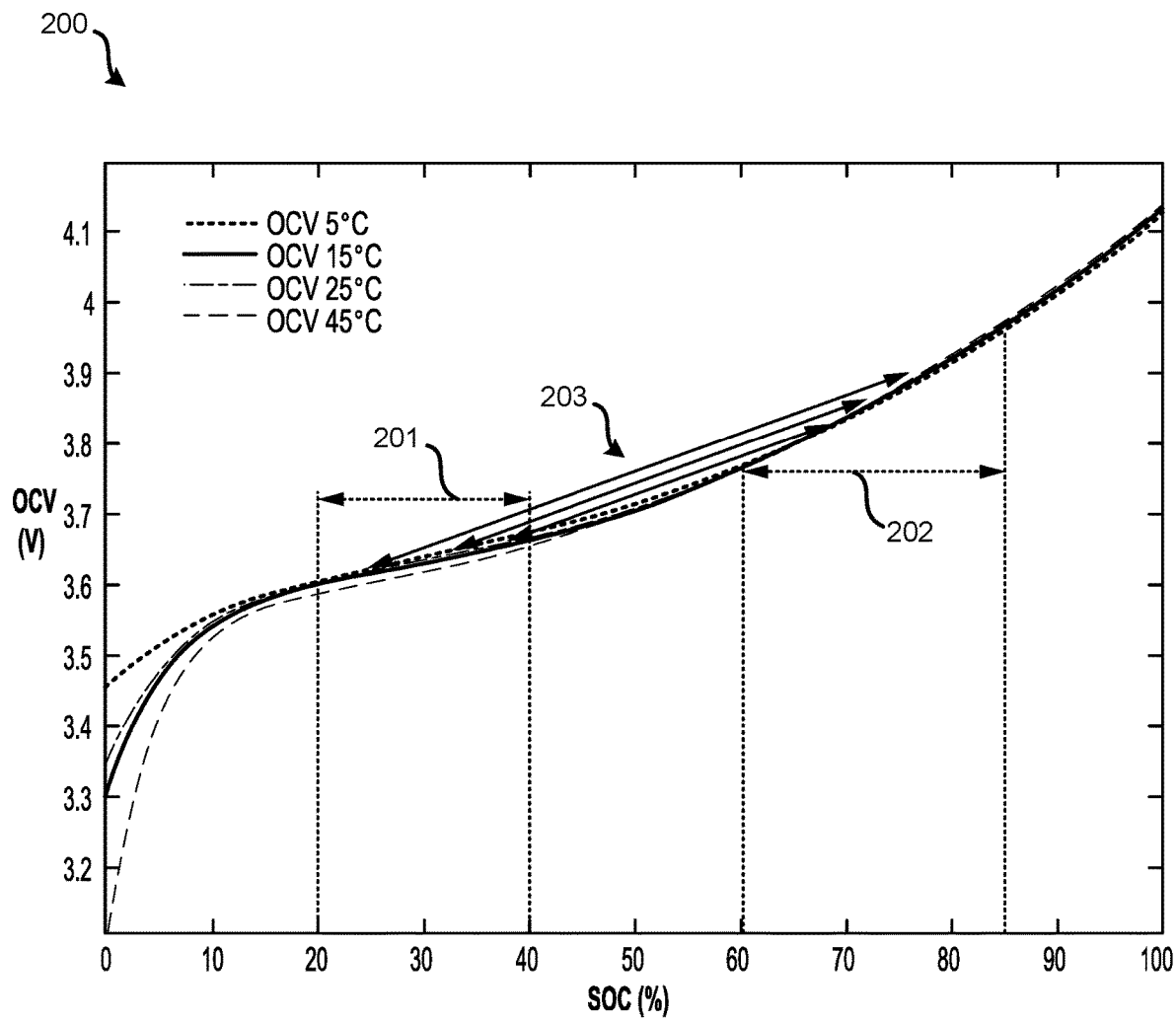
FIG. 2 illustrates an embodiment of a graph of a battery's open circuit voltage (OCV) compared to the battery's state of charge (SOC) at different temperatures.

Measurement timing engine 122 may determine when it is appropriate for an OCV measurement to be made by voltage and current measurement system 110 of vehicle battery system 105. Measurement timing engine 122 may monitor for an amount of time that has elapsed since EV 101 was last driven by power stored in vehicle battery system 105 or an amount of time that EV 101 has been turned off or stationary. Measurement timing engine 122 may also determine whether an OCV measurement obtained from voltage and current measurement system 110 is eligible to be used for an SOH calculation. Measurement timing engine 122 may access predefined SOC relationship datastore 126. Predefined SOC relationship datastore 126 may map OCV values to SOC values for an ideal or new vehicle battery system. Predefined SOC relationship datastore 126 may store data in the form of a look-up table or may store one or more equations that define a relationship between OCV and SOC. FIG. 2 illustrates a graphical representation of the relationship between OCV and SOC. Measurement timing engine 122 may determine whether a particular OCV measurement is eligible for use in calculating the SOH of vehicle battery system 105 by determining if the OCV measurement falls within a pre-defined buffer zone, as defined in relation to FIG. 2. To perform an SOH measurement, an OCV measurement from each of two SOC buffer zones may be used. In some embodiments, rather than being stored locally, a remote source may be accessed to determine the relationship between OCV and SOC for a new battery system.

SOH calculation engine 124 may use OCV measurements and coulomb counting measurements to determine the SOH of vehicle battery system 105. SOH calculation engine 124 may integrate instantaneous measurements received from coulomb counting system 115 or may receive an integrated value over a defined time period, of which a start and end time was provided to coulomb counting system 115 by on-board processing system 120. SOH calculation engine 124 (possibly in conjunction with measurement timing engine 122) may perform steps of methods 300, 400, or both. On-board processing system 120 may affect how an autonomous driving system and/or navigation system 130 functions based on the calculated SOH value. Based on the SOH value of vehicle battery system 105, autonomous driving system 130 may determine that EV 101 cannot reach a destination based on the SOH and current charge of vehicle battery system 105, and thus may require vehicle battery system 105 be recharged or replaced before the trip is started or completed. Alternatively, autonomous driving system 130 may alter a route to a destination based on the SOH value, such as to minimize distance, the total amount of energy used, or the maximum power required from vehicle battery system 105 (e.g., by eliminating a route that requires fast acceleration on an entrance ramp, or avoiding a route that involves a steep upward grade). If a navigation system is present as a stand-alone system or as part of an autonomous driving system 130, the navigation system may alter a recommended route (e.g., as drawn on a map), or request that EV 101 be recharged before or during the trip based on the calculated SOH value of vehicle battery system 105 and/or the current charge of vehicle battery system 105.

FIG. 2 illustrates an embodiment of a graph 200 of a battery's open circuit voltage (OCV) compared to the battery's state of charge (SOC). Graph 200 illustrates the OCV at various temperatures of vehicle battery system 105 when new. As can be seen, above approximately an 18% SOC, the OCV does not vary significantly based on temperature. Defined on graph 200 are two buffer zones: buffer zone 201 and buffer zone 202. Buffer zone 201 spans from 20% SOC to 40% SOC; buffer zone 202 spans from 60% SOC to 85% SOC. In order to accurately determine SOC, an OCV measurement may be made in each of buffer zones 201 and 202. As can be seen, regardless of temperature, slopes 203 are approximately the same between points in buffer zone 201 and buffer zone 202. The data of graph 200 may be stored in the form of a look-up table or may be stored in the form of one or more functions. This data may be stored in predefined SOC relationship datastore 126. Depending on the type and design of vehicle battery system 105, the specific relationship of OCV to SOC may vary; thus, the data stored in predefined SOC relationship datastore 126 may vary by embodiment. Further, the specific ranges of buffer zones 201 and 202 may vary. In other embodiments, more than two buffer zones may be present.

Figure 3:
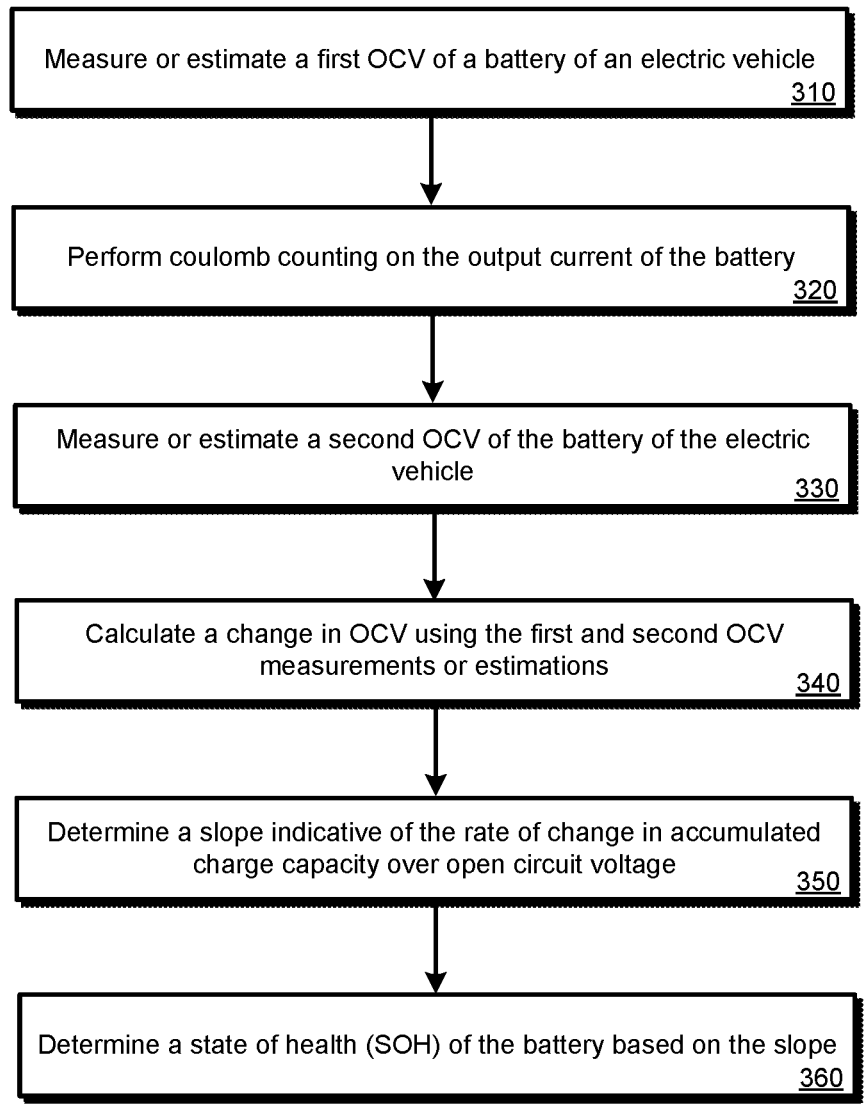
FIG. 3 illustrates an embodiment of a method for determining a battery's SOH using the battery's estimated or measured OCV.

Various methods may be performed using the systems and data of FIGS. 1 and 2. FIG. 3 illustrates an embodiment of a method 300 for determining a battery's SOH using multiple OCV measurements of the vehicle's battery system. Method 300 may be performed using the systems of embodiment 100. At block 310, a first OCV may be measured of a vehicle's battery. This first OCV measurement may be stored, such as by using a non-transitory processor-readable memory. In some embodiments, rather than the OCV being directly measured, the OCV may be estimated, such as by using a first-order equivalent circuit model as previously detailed.

At block 320, immediately following the first OCV of the battery being measured, coulomb counting may be performed, such as by coulomb counting system 115. While coulomb counting is being performed, the vehicle's battery may be outputting current; however, at times the battery may be charged (e.g., regenerative braking, solar panels, etc.). The instantaneous measurements made as part of the coulomb counting may be integrated to determine a total ampere-hours output over a time period. The time period may begin when the first OCV measurement is made at block 310 and may end at block 330 when the second OCV measurement is made at block 330. After a time, such as after a predefined period of time, a second OCV measurement may be made at block 330 of the battery's OCV. In some embodiments, rather than the OCV being directly measured, the OCV may be estimated, such as by using a first-order equivalent circuit model as previously detailed. This second OCV measurement or estimation may be stored, such as by using a non-transitory processor-readable memory.

At block 340, a change in measured or estimated OCV between blocks 310 and 330 may be determined. Equation 1 may be used to compute the change in OCV. It should be understood that the change in OCV may be negative (if the vehicle's battery has been charged) or may be positive (if the vehicle has been operated).

$$OCV_2 - OCV_1 = \Delta OCV \qquad \text{Eq. 1}$$

At block 350, a slope value may be calculated. The slope value may be representative of the change in charge (dQ) over OCV (dOCV). Equation 2 describes the slope calculation.

$$\alpha = \frac{\Delta Q}{\Delta OCV} \qquad \text{Eq. 2}$$

In Equation 2, α is the calculated slope. ΔQ refers to the accumulated charge (for example, in ampere-hours) measured by integrating the instantaneous coulomb counting measurements from block 320 that were taken between block 310 and block 330 being performed. The value of α is expected to decrease as the battery ages. That is, the stored charge that is output by the battery for a given drop in OCV is expected to decrease. The value of α can be compared to an $\alpha_{new}$ value. The value of $\alpha_{new}$ may be calculated for a new or theoretical battery. For example, the value for $\alpha_{new}$ may be calculated using the data from FIG. 2.

At block 360, an SOH of the battery may be determined using the slope value calculated using equation 2. More specifically, Equation 3 may be used to determine a percent value indicative of the relationship of α to $\alpha_{new}$. In some embodiments, the value for $\alpha_{new}$ may be obtained by performing an initial α calculation (Equation 2) when the electric vehicle was first operated or manufactured. Such an embodiment allows for $\alpha_{new}$ to be customized specifically for the particular battery system and electric vehicle.

$$SOH = \frac{\alpha}{\alpha_{new}} \times 100\% \qquad \text{Eq. 3}$$

The determined value of SOH may be a percentage indicative of the battery's capacity compared to when new or when first installed. This SOH value may then be used to determine if the battery is in need of replacement (e.g., by outputting an indication of such on the electric vehicle's display); the current total capacity of the battery; the range of the electric vehicle; and whether a recharge is necessary (e.g., before reaching an intended destination); and may be used to adjust driving characteristics to save power; turn off one or more auxiliary systems; or disable function of the electric vehicle.

Figure 4A:
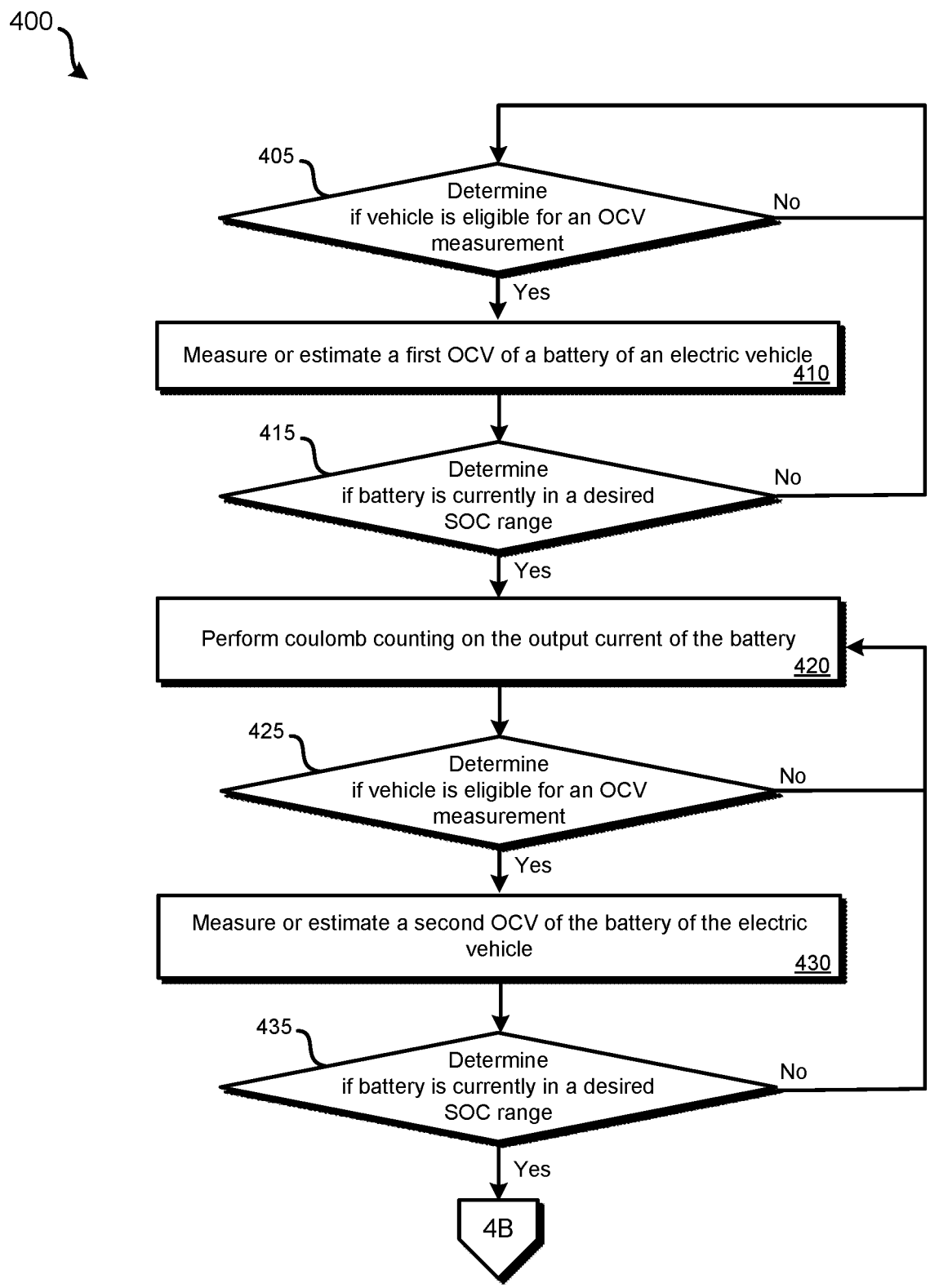
FIGS. 4A and 4B illustrate another embodiment of a method for determining a battery's SOH using the battery's OCV.
Figure 4B:
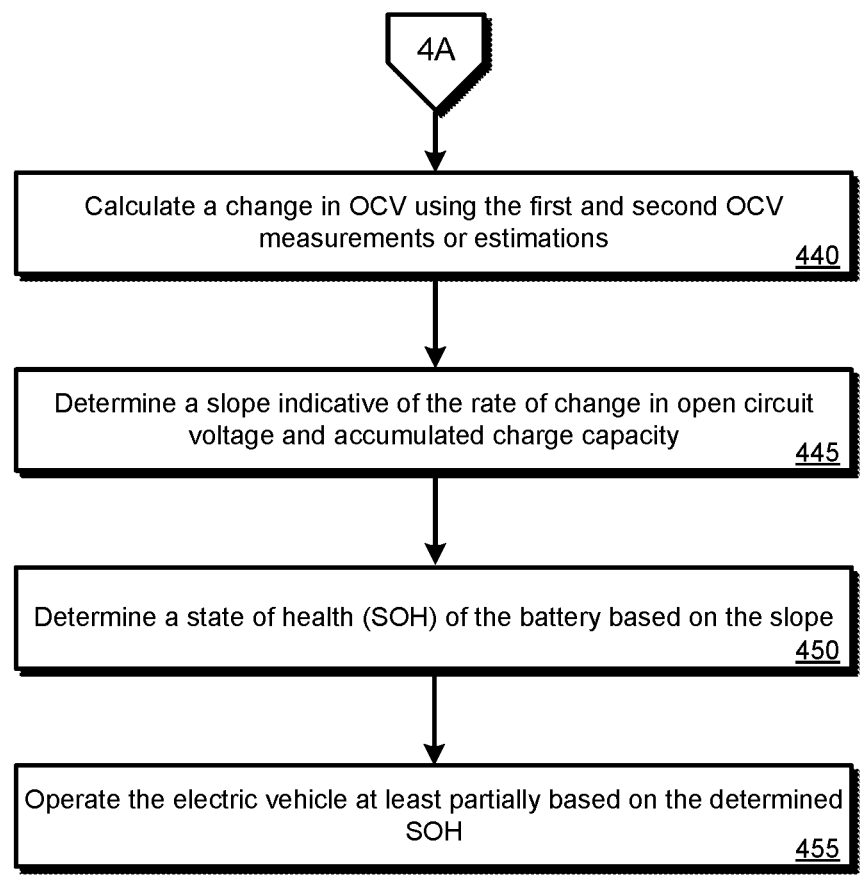

FIGS. 4A and 4B illustrate an embodiment of a method 400 for determining a battery's SOH using multiple OCV measurements of the vehicle's battery system. Method 400 may be performed using the systems of embodiment 100. Method 400 can represent a more detailed embodiment of method 300 of FIG. 3. At block 405, an initial determination may be made as to whether the electric vehicle, the vehicle's battery system, or both are eligible for an OCV measurement. Various factors may be assessed, such as by measurement timing engine 122, to determine whether eligibility for an OCV measurement is present. A first factor may be whether the vehicle is "off" or otherwise deactivated. This factor may include checking that the vehicle is set to a park position and that the vehicle's battery system is not being used to actively propel the vehicle. A second factor may be the amount of time since the vehicle's battery system was last used to power propulsion of the vehicle. In some embodiments, a minimum amount of time, such as one hour or two hours, is required to elapse before eligibility for an OCV measurement is present. Other factors can include the amount of current currently being drawn from the battery; for example, if the current draw is greater than a defined threshold (which may be close to zero), eligibility may not be present. If the battery system is currently being charged, eligibility may not be present.

At block 410, a first OCV of a vehicle's battery may be measured. The first OCV measurement may be measured as the voltage across the battery's terminals. The first OCV measurement may be performed using voltage and current measurement system 110. In some embodiments, rather than the OCV being directly measured, the OCV may be estimated, such as by using a first-order equivalent circuit model as previously detailed. This first OCV measurement or estimation may be stored, such as by using a non-transitory processor-readable memory possibly along with an indication of the particular SOC range in which the first OCV measurement was determined to be within.

At block 415, the first OCV value may be analyzed. A determination may be made whether the first OCV falls within a desired SOC range. Multiple SOC ranges (also referred to as "buffer zones") may be present. For example, referring to FIG. 2, a first SOC range may be between 20% and 40% SOC, and a second SOC range may be between 60% and 85% SOC. In other embodiments, the specific SOC ranges may vary. For example, the ranges may be smaller in size and/or have different upper and lower bounds. In some embodiments, more than two SOC ranges may be used. The first OCV value may be used to perform a lookup or calculate a function to determine the associated SOC value. To perform such a look-up or calculate a function, a look-up table or functions may be required to be accessible that relate OCV values to SOC values for the battery system (e.g., for when the battery system was new). For instance, FIG. 2 represents the relationship between OCV and SOC for a new battery system. In some embodiments, the SOC ranges can be translated into OCV ranges that can then be stored in lieu of SOC relationship data. For example, referring to FIG. 2, the first SOC range may be translated to a first OCV range of 3.62 V to 3.68 V and the second SOC range may be translated to a second OCV range of 3.79 V to 3.95 V. If it is determined that the first OCV measurement value does not fall within a SOC range, method 400 may return to block 405, such as after waiting a predefined period of time. If it is determined that the first OCV measurement value does fall within one of the SOC ranges, method 400 may proceed to block 420.

At block 420, immediately following the first OCV of the battery being measured, coulomb counting may be initiated, such as by coulomb counting system 115. While coulomb counting is being performed, the vehicle's battery may be outputting current or may be receiving current used to charge (e.g., regenerative braking, solar panels, etc.). The instantaneous measurements made as part of the coulomb counting may be integrated to determine a total amperehours output over a time period. The time period may begin when the first OCV measurement is made at block 410 and may end at block 435 when the second OCV measurement is made.

At block 425, a second determination may be made as to whether the electric vehicle, the vehicle's battery system, or both are eligible for an OCV measurement. The same factors assessed at block 405 may be assessed again at block 425. As an example, block 405 may be evaluated in the affirmative if a user has parked his EV at home overnight. Block 425 may be evaluated in the affirmative the next day while the EV is parked at the user's work. If block 425 is evaluated in the negative, coulomb counting may be continued, through both charge and discharge events. At block 430, a second OCV of a vehicle's battery may be measured. The second OCV measurement may be measured as the voltage across the battery's terminals similar to the first OCV measurement. The second OCV measurement may be performed using voltage and current measurement system 110. In some embodiments, rather than the OCV being directly measured, the OCV may be estimated, such as by using a first-order equivalent circuit model as previously detailed. This second OCV measurement or estimation may be stored, such as by using a non-transitory processor-readable memory.

At block 435, the second OCV value may be analyzed. A determination may be made whether the second OCV falls within a desired SOC range that is different from the SOC range in which the first OCV measurement was determined to be in at block 415. To be eligible, the range in which the second OCV measurement falls may need to be different from the range in which the first OCV was determined to fall. For example, referring to FIG. 2, if the first OCV measurement fell within buffer zone 201, the second OCV measurement would need to fall within buffer zone 202; or if the first OCV measurement fell within buffer zone 202, the second OCV measurement would need to fall within buffer zone 201. As detailed in relation to block 415, the second OCV value may be used to perform a lookup or calculate a function to determine the associated SOC value. To perform such a look-up or calculate a function, a look-up table or functions may be required to be accessible that relate OCV values to SOC values for the battery system (e.g., for when the battery system was new). In some embodiments, as previously detailed, the SOC ranges can be translated into OCV ranges that can then be stored in lieu of SOC relationship data. If it is determined that the first OCV measurement value does not fall within an eligible SOC range, method 400 may return to block 420, during which coulomb counting may continue uninterrupted. If it is determined that the second OCV measurement value does fall within an eligible SOC range, method 400 may proceed to block 440 (on FIG. 4B).

At block 440, a change in OCV measurements or estimations between blocks 410 and 430 may be determined. Equation 1 may be used to compute the change in OCV. It should be understood that the change in OCV may be negative (if the vehicle's battery has been charged) or may be positive (if the vehicle has been operated). At block 445, a slope value may be calculated. The slope value may be representative of the change in charge (dQ) over OCV (dOCV). Slope may be calculated based on Equation 2. The value of $\alpha$ is expected to decrease as the battery ages. That is, the stored charge that is output by the battery for a given drop in OCV is expected to decrease. The value of $\alpha$ can be compared to an $\alpha_{new}$ value. The value of $\alpha_{new}$ may be calculated for a new or theoretical battery. For example, the value for $\alpha_{new}$ may be calculated using the data from FIG. 2.

At block 450, an SOH of the battery may be determined using the slope value calculated using Equation 2. More specifically, Equation 3 may be used to determine a percent value indicative of the relationship of $\alpha$ to $\alpha_{new}$. In some embodiments, the value for $\alpha_{new}$ may be obtained by performing an initial a calculation (Equation 2) when the electric vehicle was first operated or manufactured. Such an embodiment allows for $\alpha_{new}$ to be customized specifically for the particular battery system and electric vehicle.

At block 455, the EV may be operated at least partially based on the determined SOH. The SOH value may be used to: 1) determine if the battery is in need of replacement (e.g., by outputting an indication of such on the electric vehicle's display or transmitting a message to a manufacturer or service provider), 2) determine and output an indication of the current total capacity of the battery, 3) determine the range of the electric vehicle; 4) determine whether a recharge is necessary (e.g., before reaching an intended destination); 5) alter a route that the EV is to travel (e.g., on a navigation system or controlled by an autonomous driving system); 6) adjust driving characteristics of the EV to save power; 7) turn off one or more auxiliary systems of the EV; and/or 7) disable function of the electric vehicle.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known, processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A method for determining a state of health (SOH) of a battery of an electric vehicle, the method comprising:
   measuring, using a voltage measurement system connected with the battery of the electric vehicle, a first OCV of the battery of the electric vehicle;
   performing coulomb counting on the battery of the electric vehicle to determine an accumulated capacity value in response to determining the first OCV;
   measuring, using the voltage measurement system connected with the battery of the electric vehicle, a second OCV of the battery of the electric vehicle after performing the coulomb counting;
   calculating a change in OCV value using the determined first OCV and the determined second OCV;
   determining a slope value by dividing the accumulated capacity value by the change in OCV value; and
   determining the SOH of the battery using the slope value, wherein determining the SOH of the battery using the slope value comprises dividing the slope value by a predefined slope value, wherein the predefined slope value is indicative of a state of health of the battery when new.

2. The method for determining the SOH of the battery of the electric vehicle of claim 1, wherein, while performing the coulomb counting after determining the first OCV but before determining the second OCV, the battery is charged and discharged.

3. The method for determining the SOH of the battery of the electric vehicle of claim 1, further comprising:
   operating the electric vehicle at least partially based on the determined SOH value.

4. The method for determining the SOH of the battery of the electric vehicle of claim 1, wherein determining the first OCV of the battery of the electric vehicle comprises estimating the first OCV.

5. The method for determining the SOH of the battery of the electric vehicle of claim 1, wherein determining the first OCV of the battery of the electric vehicle comprises measuring the first OCV.

6. A method for determining a state of health (SOH) of a battery of an electric vehicle, the method comprising:
   measuring a first OCV of the battery of the electric vehicle using a voltage measurement system;
   determining that the first OCV is within a first state of charge (SOC) range;
   performing coulomb counting on the battery of the electric vehicle to determine an accumulated capacity value in response to determining the first OCV, wherein coulomb counting is performed in response to determining the first OCV and determining that the first OCV is within the first SOC range;
   measuring a second OCV of the battery of the electric vehicle using the voltage measurement system after performing the coulomb counting;
   calculating a change in OCV value using the determined first OCV and the determined second OCV;
   determining a slope value by dividing the accumulated capacity value by the change in OCV value; and
   determining the SOH of the battery using the slope value.

7. The method for determining the SOH of the battery of the electric vehicle of claim 6, wherein determining that the first OCV is within the first SOC range comprises using the first OCV in combination with a predefined relationship between OCV values and SOC values.

8. The method for determining the SOH of the battery of the electric vehicle of claim 7, further comprising:
   determining that the second OCV is within a second SOC range, wherein determining the slope value is performed following determining that the second OCV is within the second SOC range.

9. The method for determining the SOH of the battery of the electric vehicle of claim 8, wherein determining that the second OCV is within the second SOC range comprises using the second OCV in combination with the predefined relationship between OCV values and SOC values.

10. The method for determining the SOH of the battery of the electric vehicle of claim 9, wherein the first SOC range and the second SOC range are each at least 15% and the first SOC range and the second SOC range are separated by at least 15%.

11. An electric vehicle system for determining a state of health (SOH) of a battery of an electric vehicle, the electric vehicle system comprising:
   a vehicle battery system installed on the electric vehicle;
   a voltage and current measurement system that measures instantaneous voltage and current measurements of the vehicle battery system; and
   an on-board processing system, installed on the electric vehicle, the on-board processing system comprising one or more processors configured to:
      determine a first OCV of the battery of the electric vehicle based on a first output of the voltage and current measurement system;
      perform coulomb counting on the battery of the electric vehicle to determine an accumulated capacity value in response to determining the first OCV;
      determine a second OCV of the battery of the electric vehicle based on a second output of the voltage and current measurement system after performing the coulomb counting;
      calculate a change in OCV value using the determined first OCV and the determined second OCV;
      determine a slope value by dividing the accumulated capacity value by the change in OCV value; and
      determine the SOH of the battery using the slope value by dividing the slope value by a predefined slope value, wherein the predefined slope value is indicative of a state of health of the battery when new.

12. The electric vehicle system of claim 11, wherein the on-board processing system being configured to determine the first OCV of the battery of the electric vehicle comprises the on-board processing system being configured to estimate the first OCV.

13. The electric vehicle system of claim 11, wherein the on-board processing system being configured to determine the first OCV of the battery of the electric vehicle comprises the on-board processing system being configured to measure the first OCV using the voltage and current measurement system.

14. The electric vehicle system of claim 11, wherein the on-board processing system is further configured to:
   determine that the first OCV is within a first state of charge (SOC) range, wherein coulomb counting is performed in response to determining the first OCV and determining that the first OCV is within the first SOC range.

15. The electric vehicle system of claim 14, wherein the on-board processing system being configured to determine that the first OCV is within the first SOC range comprises the on-board processing system being configured to use the first OCV in combination with a predefined relationship between OCV values and SOC values.

16. The electric vehicle system of claim 11, wherein the on-board processing system is further configured to determine that the second OCV is within a second SOC range, wherein the on-board processing system being configured to determine the slope value is performed following determining that the second OCV is within the second SOC range.

17. A non-transitory processor-readable medium for determining a state of health (SOH) of a battery of an electric vehicle, comprising processor-readable instructions configured to cause one or more processors to:
   determine a first OCV of the battery of the electric vehicle based upon a first output of a voltage measurement system connected with the battery of the electric vehicle;
   perform coulomb counting on the battery of the electric vehicle to determine an accumulated capacity value in response to determining the first OCV;
   determine a second OCV of the battery of the electric vehicle based upon a second output of the voltage measurement system connected with the battery of the electric vehicle after performing the coulomb counting;
   calculate a change in OCV value using the determined first OCV and the determined second OCV;
   determine a slope value by dividing the accumulated capacity value by the change in OCV value; and
   determine the SOH of the battery using the slope value by dividing the slope value by a predefined slope value, wherein the predefined slope value is indicative of a state of health of the battery when new.

* * * * *